US009239351B2

(12) United States Patent
Stagi

(10) Patent No.: US 9,239,351 B2
(45) Date of Patent: Jan. 19, 2016

(54) INJECTION PROTOCOL

(71) Applicant: UTILX Corporation, Kent, WA (US)

(72) Inventor: William R. Stagi, Burien, WA (US)

(73) Assignee: Novinium, Inc., Kent, WA (US)

(*) Notice: Subject to any disclaimer, the term of this patent is extended or adjusted under 35 U.S.C. 154(b) by 116 days.

(21) Appl. No.: 13/843,708

(22) Filed: Mar. 15, 2013

(65) Prior Publication Data

US 2014/0266271 A1    Sep. 18, 2014

(51) Int. Cl.
*G01R 31/02* (2006.01)
*G01R 31/12* (2006.01)

(52) U.S. Cl.
CPC .......... *G01R 31/021* (2013.01); *G01R 31/1272* (2013.01)

(58) Field of Classification Search
CPC .... G01R 31/03; G01R 31/08; G01R 31/1272; G01R 31/06; G01R 31/327; G01R 31/021; H02G 1/00
USPC .................................................. 324/750.01
See application file for complete search history.

(56) References Cited

U.S. PATENT DOCUMENTS

| | | | | |
|---|---|---|---|---|
| 6,161,077 A * | 12/2000 | Fawcett | ........................ | 702/58 |
| 6,809,523 B1 | 10/2004 | Ahmed | | |
| 2001/0052778 A1 * | 12/2001 | Smith | ........................ | 324/541 |
| 2008/0309351 A1 * | 12/2008 | Stewart et al. | ................ | 324/551 |
| 2011/0043244 A1 | 2/2011 | Hall | | |
| 2012/0306510 A1 * | 12/2012 | White et al. | ................. | 324/551 |

OTHER PUBLICATIONS

W.J Chatterton, "A green method for cable diagnostics coupled with selective cable restoration—re-use instead of replace" IEEE TDC, New Orleans, LA, 2010 pp. 1-4.*
J.A Bloom, "Optimal Replacement of Underground Distribution Cables." IEEE PSCE, Atlanta, GA, 2006, pp. 389-393.*
IEEE Guide for Making High-Direct-Voltage Tests on Power Cable Systems in the Field, IEEE Std 400-1980; Oct. 28, 1980, pp. 7-14.*
Ahmed, N.H., and N.N. Srinivas, "On-Line Partial Discharge Detection in Cables," 1997 IEEE Annual Report—Conference on Electrical Insulation and Dielectric Phenomena, Oct. 19-22, 1997, Minneapolis, vol. 1, pp. 214-217.
Ahmed, N.H., and N.N. Srinivas, "On-Line Partial Discharge Detection in Cables," IEEE Transactions on Dielectrics and Electrical Insulation 5(2):181-188, Apr. 1998.
Edin, H., and U. Gäfvert, "Harmonic Content in the Partial Discharge Current Measured With Dielectric Spectroscopy," 1998 IEEE Annual Report—Conference on Electrical Insulation and Dielectric Phenomena, Oct. 25-28, 1998, Atlanta, pp. 394-398.

(Continued)

*Primary Examiner* — Melissa Koval
*Assistant Examiner* — Felicia Farrow
(74) *Attorney, Agent, or Firm* — Christensen O'Connor Johnson Kindness PLLC

(57) ABSTRACT

An injection protocol for a cable includes selecting a cable for testing, selecting a pre-injection electrical discharge test for determining if electrical discharge activity occurs at or about operating voltage of the cable, configuring the cable for the pre-injection electrical discharge test; running the pre-injection electrical discharge test on the cable, and determining whether to inject the cable with a restorative fluid based upon electrical discharge activity detected at or about operating voltage of the cable.

17 Claims, 3 Drawing Sheets

(56) References Cited

OTHER PUBLICATIONS

Holbøll, J.T., et al., "Time Domain PD-Detection vs. Dielectric Spectroscopy," 1997 IEEE Annual Report—Conference on Electrical Insulation and Dielectric Phenomena, Oct. 19-22, 1997, Minneapolis, vol. 2, pp. 498-503.

"IEEE P400™/D16 Draft Guide for Field Testing and Evaluation of the Insulation of Shielded Power Cable Systems Rated 5 kV and Above," IEEE Insulated Conductors Committee, unapproved IEEE Standards Draft, Nov. 2011, 51 pages.

Léonard, F., et al., "On-Line Location of Partial Discharges in an Electrical Accessory of an Underground Power Distribution Network," 7th International Conference on Insulated Power Cables Jicable '07), Paris—Versailles, Jun. 24-28, 2007, 5 pages.

Steennis, F., et al., "Permanent on-Line Monitoring of MV Power Cables Based on Partial Discharge Detection and Localisation—An Update," 7th International Conference on Insulated Power Cables (Jicable '07), Paris—Versailles, Jun. 24-28, 2007, 6 pages.

\* cited by examiner

INJECTION PROTOCOL

BACKGROUND

As an electrical power cable ages, the dielectric strength of its insulation is reduced, thereby shortening its life expectancy. As is well known in the art, a primary mechanism for the reduction of insulation strength with cable age is a phenomenon commonly referred to as water-treeing. Over time, water, on a molecular scale and in the presence of high electrical stresses and ionic contamination, can degrade the cable insulation's structure. This degradation typically occurs at discreet points along the cable length where point defects have increased the localized electrical stress level in the insulation. The degradation further increases discreet point electrical stresses and decreases insulation strength leading to a progressive condition. As the condition grows out from the initial defect site, it often takes on a bush-like appearance giving rise to its common name: a water-tree.

Water-trees are slow growing structures which lead to cable failure, but they are not themselves the mechanism of cable failure. Failure occurs when a voltage perturbation of some sort, i.e., a lightning surge, a switching surge, etc., causes a partial breakdown in the cable's insulation at the sight of reduced strength and increased stress. That partial breakdown forms a new structure commonly referred to as an electrical-tree. The electrical-tree defect propagates through the insulation very quickly, often failing a cable within hours or days of initial inception. Thus, in summary, water-trees develop slowly, degrading the cables insulation until that degradation gives rise to an electrical-tree, which quickly propagates and fails the cable. Water-tree growth can occur on a timescale of decades but electrical-tree growth often leads to failure in a time frame of hours or days.

Water-tree growth can be stopped through any process which removes the ionic laden water from the site. The deleterious effects of the remaining water-tree structure can be reduced if the electrical stresses associated with the discontinuity of the water-tree structure are stress graded. There are chemical solutions (restorative or injection fluids) which, when injected into the conductor strands of a cable, diffuse into the cable's insulation and chemically combine with the water existing in the insulation's structural defect, thereby removing the fuel for further water tree development. In some restorative fluid processes the by-product of this reaction may serve to stress grade the point defects of the structural defect, thereby reducing its deleterious effects on the cable's insulation. In the most refined restorative fluid solutions, those by-products can be chosen such that they remain in place within the water tree structure forming a pseudo-permanent solution to the water-tree degradation.

Restorative fluid solutions intended only to mitigate the deleterious effects of water-tree growth have little effect on cables that contain electrical-tree structures. However, if a cable has been functioning properly and it has not been subjected to any service disruptions or any conditions that vary from its standard operating condition, it is very unlikely that the cable will contain an electrical-tree structure at the time it is chosen for restorative fluid injection. Because an electrical-tree typically fails a cable in a matter of hours or days, it is statistically very unlikely that any particular cable with a lifespan of 15 or more years of life will be, coincidentally, in its last days of life at the time it is selected for injection. A cable injection, when performed on a cable that has been functioning properly at standard operating conditions, is typically referred to as a pro-active cable injection.

However, if the aged cable has recently been subjected to any conditions outside of its standard operating conditions, the statistical safety net described above no longer applies. Moreover, because of the aged condition of cables being considered for chemical injection, it is impossible to estimate the specific factor of safety between the operating conditions under which the cable is currently functioning and the actual, unknown value of the ultimate dielectric strength of the cable's insulation. Without knowing the exact extent of the cable insulation's degradation it is not possible to know what level of perturbation above its standard operating condition it is able to withstand. Examples of such perturbations are:

surges due to switching the cable out and into service
application of voltages in excess of system voltage for analytical purposes
surges that occur during cable failures and fault location
application of DC voltage testing, resulting in space charge development A cable injection, when performed on a cable which has recently been subjected to any non-standard conditions or perturbations outside of its standard operating condition, is typically referred to as a re-active cable injection. Often the 'non-standard condition' is an actual cable fault. In that case the decision to inject the cable is a reaction to the obvious weakness of the cable indicated by the fact that it has already faulted at least once. However, any one of a number of perturbations or deviations from standard operating conditions, such as those listed above, would classify the injection as a re-active cable injection.

As one would expect, the failure rate for cables injected in a re-active manner is significantly higher than the failure rate for cables injected in a pro-active manner.

Injecting a cable that already contains an electrical tree is undesirable since ultimately the materials and labor are wasted on the effort. Detecting the presence of an electrical tree before injection is; therefore, highly desirable. Fortunately, between the inception of an electrical tree structure and the time that the electrical tree actually fails the cable, its presence can be detected using any test methodology that can detect the presence of an active partial discharge within the cable insulation. Additionally, tests which are sensitive enough to detect the partial discharging of an active electrical tree are also typically able to detect other electrical system discharge activities such as arcing, surface discharging, etc. These discharges also indicate issues that one would want to be aware of and perhaps address before injecting a cable.

The cable rejuvenation injection protocol of the present disclosure incorporates analytical methods of detecting active partial or full discharge activity; hereinafter sometimes collectively referred to as an "electrical discharge" or "discharge" occurring at system voltage into a cable rejuvenation injection process. Such methods include specialized test procedures aimed at eliminating the possibility of injecting a cable that already contains an electrical tree discharging at or about system voltage. The cable rejuvenation injection protocol may also include a step for checking the cable immediately after it has been chemically injected and returned to service in order to assure that any craftwork or switching process performed in the standard course of the cable rejuvenation injection process did not incite a new electrical-tree or other cable or system defect.

The testing performed as a part of this overall cable rejuvenation injection protocol should be distinguished from test protocols that are designed to evaluate the general condition of a cable for the purpose of prioritizing the replacement sequence of a population of cables. Currently there are a number of testing devices and procedures available that are used to try to ascertain a qualitative analysis of a cable insulation's health. Often, the goal is to prioritize cables for replacement. The cables that have the most degraded insulation are prioritized for replacement while the cables with the least aging are allowed to remain in service.

A typical test isolates the cable from the rest of the system and then uses an exterior power supply to incrementally raise the voltage of the cable in multiples of its operating voltage. Many of these tests use some indicator to determine at what voltage an electrical discharge occurs. In the specific case of water tree evaluation, different technologies take advantage of different phenomenon to make this determination. But most tests that work on this principle ultimately incite a discharge event by increasing the test voltage and then drawing conclusions about the cable's condition based largely on the size of the gap between the operating voltage of the cable and the inception voltage of the discharge incited by the test.

Unfortunately, these tests are not helpful at determining cable injection suitability. These tests typically require that the cable be switched out of service for the testing to be performed. Additionally, they require that overvoltage be applied to the cable to incite a discharge event. Therefore, the tests themselves create circumstances that take a cable from its proactive state to a reactive state. Moreover, the objective of these tests is to identify and replace the cables in the most aged, water treed condition. These are the cables that are the most likely to be seriously damaged by this testing approach. However, since the test is being used to determine the priority for cable replacement, the potential damage to the cable caused by the test can be considered a reasonable risk. In comparison, an objective of the injection protocol of the present disclosure is to rejuvenate the most aged (highly water-treed) cables, which are the cables most likely to be damaged by the overvoltage testing and rendered un-suitable for injection. Thus, it can be appreciated from the foregoing that there is a need for an improved method for determining cable injection suitability performed at the time, and as a part of the cable rejuvenation injection process.

SUMMARY

An injection protocol for a cable includes selecting a cable for testing, selecting a pre-injection electrical discharge test for determining if electrical discharge activity occurs at or about operating voltage of the cable, configuring the cable for the pre-injection electrical discharge test; running the pre-injection electrical discharge test on the cable, and determining whether to inject the cable with a restorative fluid based upon electrical discharge activity detected at or about operating voltage of the cable.

The injection protocol may further include selecting an off-line in-process electrical discharge test for determining if electrical discharge activity occurs at or about operating voltage of the cable after at least one of configuring the cable for injection and injecting the cable with a restorative fluid, configuring the cable for the off-line in-process electrical discharge test, running the off-line in-process electrical discharge test on the cable, and evaluating the electrical discharge activity detected at or about operating voltage of the cable.

The injection protocol may further include selecting an on-line post-injection electrical discharge test for determining if electrical discharge activity occurs at or about operating voltage of the cable after the cable has been injected with a restorative fluid and connected to a system power source, configuring the cable for the on-line post-injection electrical discharge test, running the on-line post-injection electrical discharge test on the cable, determining whether to leave the cable on-line based, at least in part, upon electrical discharge activity detected at or about operating voltage of the cable.

The injection protocol may further include selecting an on-line pre-injection TDR assessment test for detecting a change in cable impedance, configuring the cable for the on-line pre-injection TDR assessment test, running, prior to injecting the cable with a restorative fluid, the on-line pre-injection TDR assessment test, analyzing the detected changes in cable impedance, making the determination of whether to proceed with one of injecting the cable or running an on-line pre-injection electrical discharge test based, at least partially, on the detected changes in cable impedance.

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Figure 1A:
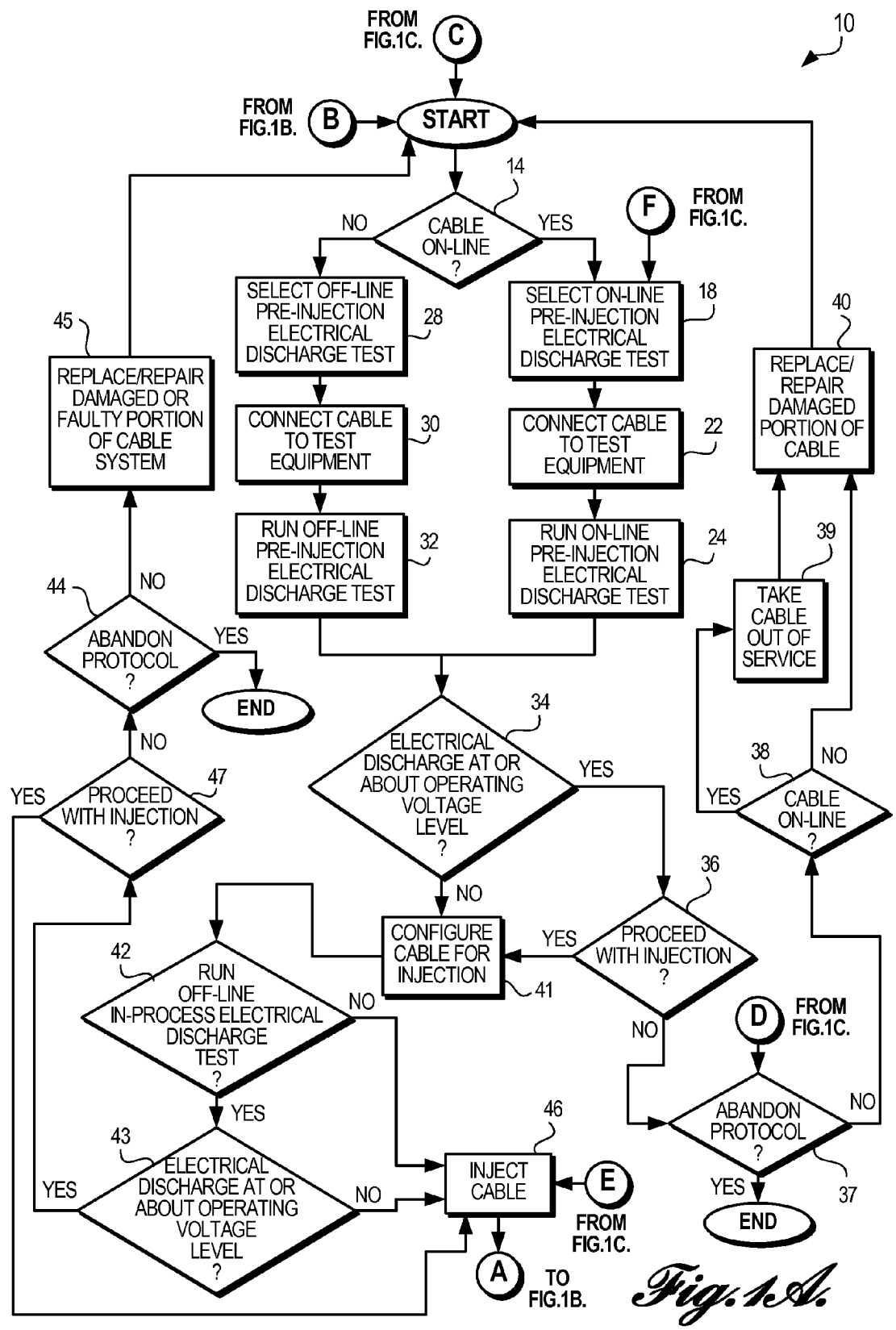
FIG. 1A is a flow chart depicting a first portion of a cable rejuvenation injection protocol of an exemplary embodiment of the present disclosure.

A cable rejuvenation injection protocol formed in accordance with an exemplary embodiment of the present disclosure incorporates analytical methods of detecting active electrical tree activity or other system defects occurring at or about system operating voltage into a cable rejuvenation injection process. The analytical methods or tests of the cable rejuvenation injection protocol substantially eliminate the possibility of injecting a cable that already contains an electrical tree that discharges partially at or about system voltage. Moreover, the cable rejuvenation injection protocol may also be used to ensure that the craftwork was properly performed during the cable injection process and that switching the cable back into service did not incite any new electrical trees or other discharging system defects. As noted in the Background section above, the testing performed as a part of the cable rejuvenation injection protocol should be distinguished from test protocols that are designed to evaluate the general condition of a cable for the purpose of prioritizing the cable for replacement.

It should be appreciated that "at or about operating voltage level" is meant to include any voltage equal to or less than the system operating voltage of the cable, including any surges and voltage perturbations that may reasonably be expected to affect the cable during its standard usage. Such a voltage level range would typically include voltage levels exceeding the nominal system operating voltage operating level by as much as about +15%. However, the voltage level chosen for use with a test may be in the range of up to about 1.75 times the value of the system operating voltage of the cable. The range of voltage levels suitable for conducting the chosen test for carrying out the cable rejuvenation injection protocol may be easily determined by one of ordinary skill through undue experimentation. Thus, it should be appreciated that the values set forth herein are exemplary only, and are not intended to limit the scope of the claimed subject matter.

Aspects of the cable rejuvenation injection protocol will now be described in further detail. The cable rejuvenation injection protocol includes selecting an aged cable as an injection candidate and then testing that cable for pre-injection suitability. The pre-injection suitability test may include a pre-injection electrical discharge test to determine whether a cable is suitable for injection. As will become apparent from the description that follows, the pre-injection electrical discharge test may be any one of a variety of suitable on-line or off-line tests for detecting electrical tree activity or other discharges in the cable at or around system operating voltage. The pre-injection suitability test may also be or include an on-line time domain reflectometry test to determine splice count, neutral condition, or any other impedance changing phenomenon that may impact the evaluation of a cable's suitability for injection, as will be discussed further below.

Upon selecting the pre-injection electrical discharge test, the test is run to determine if an electrical tree or other discharge is present in the cable at or around system operating voltage. If the pre-injection test indicates that an electrical tree or other discharge is present in the cable at or around system operating voltage, the extent of the discharge will be evaluated, and injection may proceed, the injection may be abandoned, or the damaged portion of the cable may be repaired or replaced and then optionally re-tested. If the pre-injection test indicates that no electrical tree or other discharge is present in the cable at or around system operating voltage, the cable is injected with a restorative fluid to halt further water-tree development and reduce the deleterious effects of the remaining water-tree structure.

In order to perform a cable injection, the cable has to be taken out of service. Moreover, a significant amount of craftwork needs to be performed in preparation for and as a follow-up to cable injection. Ultimately taking the cable out of service, changing the terminations and splices on the cable, and then re-energizing the cable all create circumstances that could incite electrical tree development or other system defects.

In that regard, one or more optional in-process electrical discharge tests may be performed during and following the injection to ensure that the craftwork was properly performed and that the cable insulation, joints, terminations, or other cable system components remain free of electrical-trees or other defects. For instance, a first off-line in-process test may be run after all splices, terminations, etc., have been replaced, but before injection. In this manner, a poorly installed splice, termination, etc., would not have to be fixed after fluid has been injected into the cable. If no electrical-tree or other electrical discharge is detected during the first off-line in-process electrical discharge test, the cable injected with restorative fluid. If an electrical-tree or other electrical discharge is detected during the first off-line in-process electrical discharge test, the extent of the discharge will be evaluated. Based on the evaluation, the cable may be nevertheless injected, the protocol maybe be abandoned, or the damaged portion of the cable (including splices, terminations, etc.) may be repaired or replaced and then optionally re-tested.

In the alternative or in addition thereto, a second off-line in-process test may be done after fluid injection is complete. The second off-line in-process electrical discharge test is done before the cable is re-energized to determine if electrical tree development or other defects were incited during the fluid injection process. If no electrical-tree or other electrical discharge is detected during the second off-line in-process electrical discharge test, the cable is re-energized and left to soak. If an electrical-tree or other electrical discharge is detected during the second off-line in-process electrical discharge test, the extent of the discharge will be evaluated. Based on the evaluation, the cable may be nevertheless re-energized (i.e., brought back on-line), the protocol maybe be abandoned, or the damaged portion of the cable (including splices, terminations, etc.) may be repaired or replaced and then optionally re-tested. This second off-line in-process electrical discharge test can also serve as a proof, or continuity test eliminating the need for a more damaging DC hi-pot test.

An on-line post-injection electrical discharge test may be run on the treated cable immediately after it has been switched back into energized service to again determine if a discharge is present at or around system operating voltage. This on-line post-injection electrical discharge test helps ensure that the craftsmanship performed during the injection process was proper, and that the final "switching in" processes (which occasionally cause surges in the voltage) required to re-energize the cable did not incite any additional electrical-tree development or other system defects. The use of a post-injection on-line test therefore provides a final check after all processes of the injection procedure have been completed. If a discharge is detected during the on-line post-injection electrical discharge test, the extent of the discharge will be evaluated. Based on the evaluation, the cable may be nevertheless left in service or on-line, the protocol maybe be abandoned, or the damaged portion of the cable (including splices, terminations, etc.) may be repaired or replaced and then optionally re-tested. If no discharges are present during the on-line post-injection electrical discharge test, the cable may be left in service to absorb the injected restorative fluid.

The on-line post-injection electrical discharge test should be performed as soon as is practically possible after re-energizing the cable. For instance, in the preferred embodiment of the cable rejuvenation injection protocol, the post-injection electrical discharge test is performed within about 7 days after injecting and re-energizing the cable. However, it should be appreciated that the on-line post-injection electrical discharge test may be performed within any suitable amount of time after injecting and re-energizing the cable, as can be appreciated by one of ordinary skill in the art.

The newly-injected cable remains vulnerable to damage until a reasonable amount of fluid diffusion and distribution into the cable insulation has occurred. In that regard, it would be beneficial to monitor the cable for electrical tree activity or discharges while the cable is left in operation to absorb the injected restorative fluid. The cable may be monitored either intermittently or continuously for discharge activity. On-line electrical discharge monitoring may be achieved by installing one or more sensors inductively, capacitively, directly, or in some combination thereof to the cable or the electromagnetic field generated by the cable, and monitoring the output of the sensors with an automatic monitoring system.

The cable rejuvenation injection protocol will now be further described with reference to a number of different on-line and off-line tests for determining if an electrical discharge is present at or around system operating voltage at different stages of the injection process. Exemplary on-line and offline tests that are well known in the art will be briefly described for convenience purposes only, wherein standards, references, etc., that describe and set forth the detailed requirements for each test are widely available and well known to those in the art. It should further be appreciated that any suitable on-line or off-line test may be used to determine if an electrical discharge is present at or around system operating voltage. Thus, the brief description of each test should not be seen as limiting the scope of the cable rejuvenation injection protocol, as described and claimed.

Numerous tests are available for determining if an electrical discharge is present in a cable when stressed at various levels of its operative voltage. Virtually all of these tests are described in the IEEE standard number 400-2012 IEEE Guide for Field Testing an Evaluation of the Insulation of Shielded Power Cable Systems Rated 5 kV and Above. These tests are classified into two very broad categories, on-line and off-line testing. On-line testing is performed while the cable is in service and energized. Off-line testing is performed after the cable has been temporarily taken out of service.

On-line testing is ideal for pre-injection electrical discharge testing in a pro-active case since the cable is still connected to its network and energized at system voltage at the time the injection practitioner arrives to perform the cable injection. On-line testing is also used for the on-line post-injection electrical discharge test after the cable is re-energized to help ensure that the craftwork and the final switching processes required to re-energize the cable did not incite any additional electrical-tree development or other system defects.

With the cable in service and energized, the on-line test proceeds by coupling a sensor capacitively, inductively directly, or in some combination to the cable, or the electromagnetic field (EMF) of the cable. Partial discharge events (hereinafter sometimes referred to as "PD events") that occur in the cable's insulation create measurable changes in the anticipated EMF produced by the operating cable. The PD events are an indication that an electrical-tree is present in the cable.

A detailed description of a methodology for analyzing partial discharge using the on-line method is provided by the disclosure of N. H. Ahmed and N. N. E. Srinivas, "On-line Partial Discharge Detection in Cables," I.E.E.E. Transactions on Dielectrics and Electrical Insulation, Vol. 5, No. 2, pp. 181-188 (April 1998), and further described in U.S. Pat. No. 6,809,523, entitled "On-line Detection of Partial Discharge in Electrical Power Systems," filed Oct. 16, 1998, the disclosures of which are hereby expressly incorporated by reference herein. This on-line test includes the detection of PD events in an on-line power cable that distinguishes the partial discharges from surrounding electromagnetic interference. It should be appreciated that this on-line test may also be used to detect full discharges.

The aforementioned on-line test may be used to carry out the pre-injection electrical discharge test of the cable rejuvenation injection protocol. If an electrical discharge is detected and determined to be coming from a defect in the cable system, the cable defect is analyzed and it is determined whether action needs to be taken in advance of injection. If action needs to be taken, an effort may be made to cut out and replace the discharging section of the cable before re-starting the cable rejuvenation injection protocol. Otherwise, the cable may be injected as is, or determined not to be a good candidate for injection. If it is determined that no discharge event occurred in the cable under test, the cable is determined to be suitable for restorative fluid injection.

The aforementioned on-line test may also be used to carry out the on-line post-injection electrical discharge test of the cable rejuvenation injection protocol. After injection, the cable is re-energized and brought back into service. If an electrical discharge is detected during the on-line post-injection electrical discharge test, the damaged portion of the cable may be repaired or replaced and then optionally re-tested. If no partial or full discharge is present during the post-injection electrical discharge test, or if the discharge is deemed to be insignificant the cable may be left in service to absorb the injected restorative fluid.

Several additional examples of on-line PD detection tests are set forth in the following documents, with each document being incorporated by reference herein: Cantin, B., et al., "On-Line Location of Partial Discharge in an Electrical Accessory of an Underground Power Distribution Network," Proceedings Jicable '07, 7th International Conf. Insulated Power Cables, Versailles, France, Paper A.7.2, 2007; Cigre, W. G., D1.33.03, "Guidelines for Unconventional Partial Discharge Measurements," brochure in preparation, 2009; Stennis, F. et al., "Permanent on-Line Monitoring of MV Power Cables Based on Partial Discharge Detection and Localisation—an Update," Proceedings Jicable '07, 7th International Conf. Insulated Power Cables, Versailles, France, Paper A.4.1, 2007. It should be appreciated that any of these aforementioned on-line PD tests may also be used to detect full discharges.

A second option for the pre-injection electrical discharge test of a cable to determine if a discharge is present at or about system operating voltage is the off-line partial discharge (PD) test. This option is particularly well suited to the pre-injection electrical discharge testing of cables which have failed and are out of service at the time the injection is to occur (a reactive case). An off-line PD test may also be used to detect partial or full discharges for the optional off-line post-injection electrical discharge test, which occurs after all injection steps have been performed but before the cable is re-energized to determine if electrical-tree development was incited during switching processes, and to verify that all craftwork was properly performed.

An off-line PD test uses an external power supply to energize a cable that has been isolated from the cable system. Sensors, coupled to the cable inductively, capacitively, directly, or in some combination thereof can then be used to detect the presence of discharge in the cable in a manner similar to that described in the on-line case.

In current practice, the off-line PD test is typically done at some multiple of system voltage. However, it is the assertion of the presently disclosed cable rejuvenation injection protocol that by performing the off-line PD test at or about system voltage and immediately before or after injection, one can detect the presence or absence of electrical-trees or other cable or system defects by their discharge signatures without subjecting the cable to potentially damaging voltages above those in which the cable is typically operated. In this way, with regard to the pre-injection electrical discharge test, cable injection is not performed on a cable that will not benefit from the injection, and with regard to the post-injection electrical discharge tests, the cable is not left in a damaged state.

The preferred pre-injection and post-injection electrical discharge tests of the cable rejuvenation injection protocol investigate the presence or absence of active electrical-trees or other discharges in a cable's insulation using either on-line or off-line partial discharge diagnostic methods at or about the cable's operating voltage. However, there are a number of cable insulation diagnostic methods that measure phenomenon other than discharges. In some cases, the phenomenon that they measure are, in-fact, indirect indicators of the presence of a discharge. It should be appreciated that any technique that establishes the presence or absence of a partial or full discharge event in the cable's insulation, terminations, splices, or any part of the cable system, either directly or indirectly when measured at voltage levels at or about system voltage, immediately before and after injection are appropriate to be used during the testing portion of this injection protocol.

An example of a test that indirectly establishes the presence of a partial discharge event is the tan delta diagnostic test. The tan delta diagnostic test is used to ascertain the dielectric loss of a cable's insulation in the presence of an AC electrical field. If a cable's conductor is insulated with a perfect dielectric, the capacitive current across the dielectric material is ninety degrees (90°) out of phase with the AC voltage applied to the conductor. Any deviation in this phase angle indicates a less than perfect dielectric. The tangent of the offset of the phase angle from the 90° phase angle reference is the conventional dielectric standard measurement often referred to as the tan delta of the material.

While the tan delta test is typically viewed as a bulk material property, it can be used to indicate the existence of an electrical-tree or other discharge in two ways. The first method can include the comparison of the tan delta measurement to historical tan delta data. If the tan delta measurement is extremely high when compared to historical tan delta data of the insulating material, the measurement indicates that partial (or full) discharge is occurring across some portion of the cable system.

The second method is to look for the presence of the tan delta 'tip-up' with increasing voltage to indicate discharge activity in a dielectric material. It has been determined that in a properly functioning dielectric material operating within its functional limits, tan delta values do not vary significantly with increasing voltage. The point at which the tan delta values do become strongly dependent on the value of the applied voltage is called the tip up point, which indicates the onset of partial discharge in a cable's insulation. With regard to the presently disclosed cable rejuvenation injection protocol, if the tan delta 'tip up' point has its inflection point at or around the operating voltage of the cable, it would indicate that an electrical-tree defect or other discharge is present in the cable at or about the operating voltage level, and the cable should not be injected, brought back into service, etc., unless that defect site is located and replaced.

Another method used to indicate the presence of an electrical tree or other defect in a cable's insulation is known as Dielectric Spectroscopy. Dielectric Spectroscopy is the frequency domain measurement of dielectric loss variations with voltage. A detailed description of a methodology for analyzing partial discharge using Dielectric Spectroscopy is provided by the disclosure of J. T. Holboll, U. Gafvert, H. Edin, "Time Domain PD-detection vs. Dielectric Spectroscopy," *Conference on Electrical Insulation and Dielectric Phenomena*, Minneapolis, US, pp. 498-503, October, 1997, the disclosure of which is expressly incorporated by reference herein. When Dielectric Spectroscopy is performed at or around system voltage, it too would fall within the scope of the cable rejuvenation injection protocol.

Another test which could be used as an indicator of electrical discharge activity is the DC leakage current test, which is a time domain measurement of the dielectric response. The DC leakage current test measures the charging currents of a cable over a period of time after a DC step voltage is applied. The DC leakage current is an exponentially decay curve with respect to time when a cable is in good insulating condition. Abnormalities, such as current spikes, will be present in the DC leakage current curve when a cable defect enters partial discharge. A more detailed explanation of a method for carrying out the DC leakage current test is set forth in "Final Report on Non destructive water-tree detection in XLPE cable insulation," CIGRE SC B1 DOC 10/27, the disclosure of which is expressly incorporated by reference herein.

Another investigative technique for detecting discharge events is known as Harmonic Distortion, which is the measurement of harmonics in the dielectric loss current. The harmonic components are analyzed from Fast Fourier Transform of the measured AC loss current. Due to the signal pattern related to an internal partial discharge from cable dielectric, the third harmonics will dominate the loss current. A tip up results in the third harmonic current with increasing voltage when partial discharge enters the cable defect. Similar tip up occurs at other harmonics with less amplitude. A more detailed explanation of a method for carrying out Harmonic Distortion is set forth in H. Edin, U. Gafvert, "Harmonic Content in the Partial Discharge Current Measured with Dielectric Spectroscopy," Conference on Electrical Insulation and Dielectric Phenomena, Atlanta, US, pp. 394-398, October 1998, the disclosure of which is expressly incorporated by reference herein.

It should be appreciated that any of the foregoing tests (tan delta test, tan delta tip-up test, Dielectric Spectroscopy, DC leakage current test, and Harmonic Distortion), as well as any other test suitable for indirectly or directly detecting electrical discharges, may be used to detect both electrical trees (partial discharge) as well as other discharges. Thus, the foregoing description should not be seen as limiting the scope of the claimed subject matter.

It should also be noted that any of the off-line tests described above as well as other tests aimed at the same purpose can be performed with any suitable alternative power supply sources. While the tests often take on the name of the alternative power source used, the principle of the test is unchanged. For example, an alternate method of energizing a disconnected cable with an alternating voltage for the purposes of testing is through the use of a Damped AC or DAC test. An oscillating wave test set (OWTS) is used to produce the damped AC voltage. The cable (a capacitor) is slowly charged with a series inductance utilizing a variable high voltage direct current (HVDC) source. At the desired voltage, a switch is thrown, and the cable is discharged through the inductor. The combination of capacitance (C) and inductance (L) of the set determines the oscillation frequency (f) through the following equation:

$$f = 1/(2\pi\sqrt{LC})$$

Due to the shorter duration of the excitation, the values and decaying characteristics of the voltage tests results cannot be compared to those obtained with continuous AC. Since the OW tests lasts only a few seconds, it is considered less destructive than very low frequency (VLF). However, once the oscillating AC voltage is developed, the response of the cable can be monitored using the techniques described above. The test can be monitored by measuring partial discharges and/or by measuring the dielectric response of the insulation.

It can be appreciated that the exemplary embodiment of a cable rejuvenation injection protocol described above incorporates analytical methods of detecting active electrical tree activity or other discharges occurring at or about operating voltage level. In an alternative embodiment, the cable rejuvenation injection protocol may further include an on-line Time Domain Reflectometer pre-injection assessment for identifying certain properties of the cable and cable system to determine if the cable is suitable for injection.

A Time Domain Reflectometer (TDR) is an apparatus that can be used to analyze a cable for changes in cable impedance in order to locate anomalies associated with those impedance changes. A TDR transmits a pulse of electrical energy onto a cable. When the electrical pulse encounters an impedance change along the cable's length, part of the pulse's energy is reflected back toward the TDR. By measuring, for example, the amplitude and polarity of the reflected wave, the proportionality of the impedance change can be determined. Additionally, by measuring the time of propagation of the pulse, the location of the impedance change can also be determined. Typical anomalies that will cause an impedance change include but are not limited to splices, faults, neutral corrosion, broken conductors, etc.

Currently a TDR assessment is a standard pre-screening cable injection process employed by most operators for identifying splice count, splice location and the condition of a cable's neutral. Identification of these cable system properties is important because often a cable will be eliminated from consideration as an injection candidate if it contains a large number of splices or if the neutral system of the cable is not considered sound enough to warrant the rejuvenation of the cable's insulation. As the TDR pre-screening assessment is currently practiced however, the cable must be de-energized (i.e., it must be offline), and often the cable must have its terminations removed in order to effectively attach TDR equipment to the cable. Taking the cable out of and back into service for the assessment adds costs to the injection process, and it causes wear and tear on the cable. Moreover, the expense and wear and tear is of course needless and wasted effort in the case where the test has deemed the cable unsuitable for injection.

New technology however, now allows a TDR to be employed on-line without first de-energizing the cable. A detailed description of on-line TDR assessment is described in U.S. patent application Ser. No. 12/820,886, entitled "On-line Time Domain Reflectometer System," filed Jun. 22, 2010, the disclosure of which is expressly incorporated by reference herein. By employing on-line TDR technology, a cable can be screened prior to injection without taking the cable out of service.

Using the on-line TDR pre-injection assessment test of the alternative cable rejuvenation injection protocol embodiment, a cable may be eliminated from consideration as an injection candidate if it contains a large number of splices or if the neutral system of the cable is not considered sound enough to warrant the rejuvenation of the cable's insulation. The on-line TDR pre-injection assessment test may be use in combination with any of the foregoing on-line and off-line pre-injection electrical discharge tests described above for detecting electrical discharge activity. In the alternative, the on-line TDR pre-injection assessment test may be used as the sole pre-injection test for determining cable injection suitability. It should also be appreciated that although the on-line TDR pre-injection assessment test is described with reference to the disclosure set forth in U.S. patent application Ser. No. 12/820,886, any suitable on-line TDR assessment test or method now known or later developed may also being suitable for use.

Figure 1B:
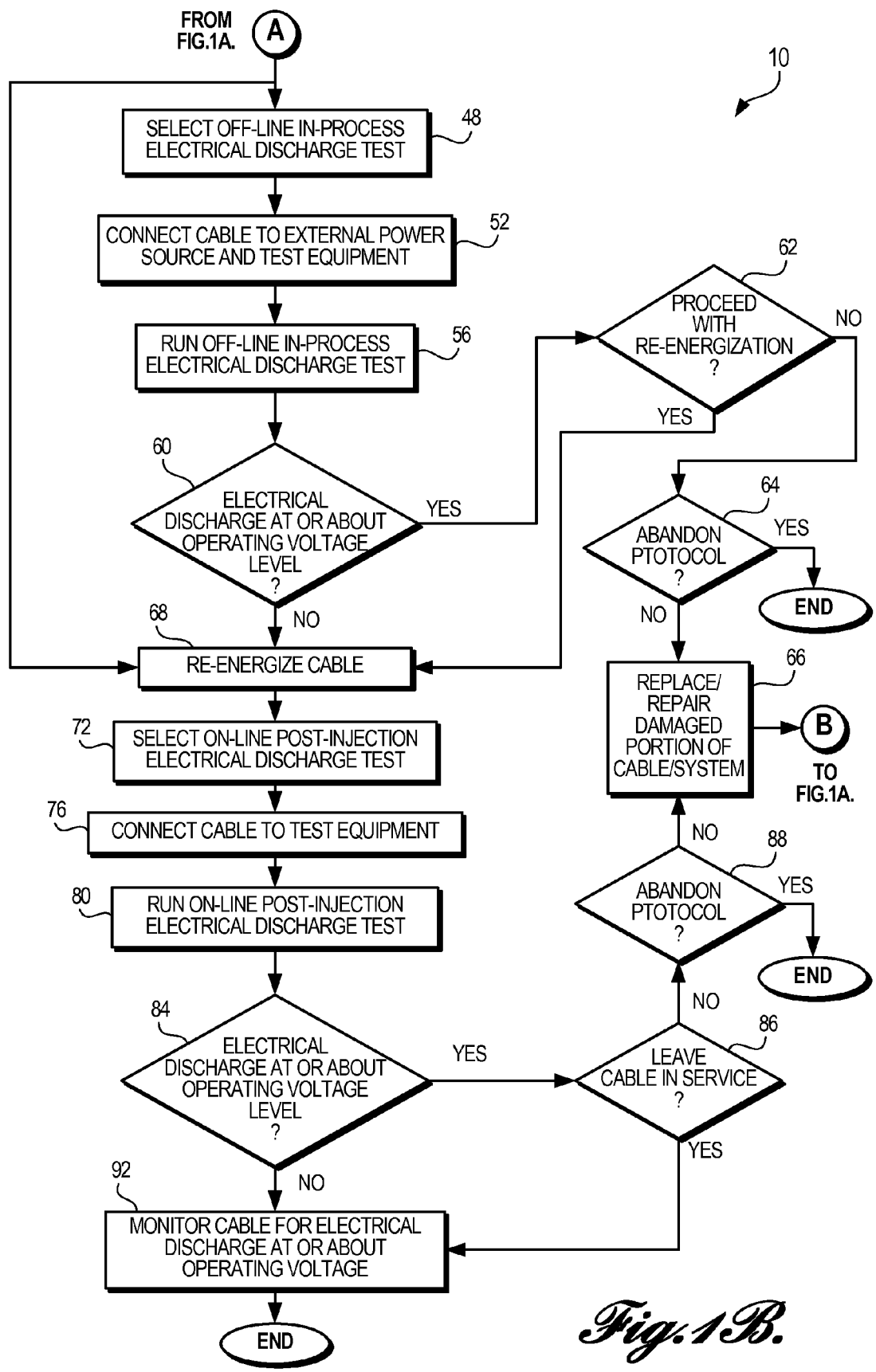
FIG. 1B is a flow chart depicting a second portion of the cable rejuvenation injection protocol of an exemplary embodiment of the present disclosure.

Referring to FIGS. 1A and 1B, an exemplary embodiment of the cable rejuvenation injection protocol 10, which may be used to determine whether an aged cable is suitable for restorative fluid injection, will be described in detail. The cable rejuvenation injection protocol 10 may be used in conjunction with any of the above-described on-line and off-line tests or any other suitable test.

Referring first to FIG. 1A, to begin the cable rejuvenation injection protocol 10, an appropriate pre-injection electrical discharge test must be selected for determining if electrical tree activity or other discharge activity occurs in the cable at or around system voltage. In making the determination whether to use an on-line electrical discharge test or an off-line electrical discharge test, it may first be determined whether the cable is in service, or on-line, when selected, as indicated by decision block 14. If the cable is on-line when selected, an on-line pre-injection electrical discharge test may likely be chosen, as indicated by block 18. If an on-line pre-injection electrical discharge test is chosen, the appropriate equipment and test devices are connected to the cable for running the on-line pre-injection electrical discharge test, as indicated by block 22. The on-line pre-injection electrical discharge test is then run to determine if electrical-tree activity (or any other discharge activity) occurs in the cable at or around system voltage, as indicated by block 24.

If the cable is off-line when selected, an off-line pre-injection electrical discharge test may likely be chosen instead, as indicated by block 28. The appropriate equipment, test devices, and external power source(s) are then connected to the cable and configured to detect electrical tree activity or other discharges at or around operating voltage level, as indicated by block 30. The off-line pre-injection electrical discharge test is then run to determine if electrical-tree activity (or any other discharge activity) occurs at or around operating voltage level, as indicated by block 32. It should be appreciated that the on-line or off-line pre-injection electrical discharge test may be chosen irrespective of whether the selected cable is on-line or off-line when chosen for testing.

Upon running the appropriate on-line or off-line pre-injection electrical discharge test, a determination is made as to whether electrical-tree activity or other discharge activity occurred at or about operating voltage level, as indicated by decision block 34. If discharge activity was detected during the pre-injection electrical discharge test, the extent of the discharge activity is evaluated, and a determination will be made whether to proceed with the injection, as indicated by decision block 36. If, based on the evaluation of the discharge activity, it is determined that the cable is not a good injection candidate, it will next be determined whether to abandon the injection protocol, as indicated by decision block 37. If the cable rejuvenation injection protocol 10 is not abandoned, and if the cable is on-line, as indicated by decision block 38, the cable is taken out of service, as indicated by block 39. Once out of service, the damaged portion of the cable may be replaced or repaired, as indicated by block 40, and a pre-injection electrical discharge test (likely offline) may be run again to determine if the repaired cable is suitable for injection.

If no electrical tree activity or any other discharge activity was detected during the pre-injection electrical discharge test, the cable is disconnected from the system power source or external power source and any test equipment, and the cable is configured for injection, as indicated by block 41.

After the cable is configured for injection (e.g., replacing all splices, terminations, etc.), a determination is made whether to run an optional first off-line in-process electrical discharge test to ensure that the configuration was properly performed, as indicated by decision block 42. If by-passing the first off-line in-process electrical discharge test, the cable may be injected, as indicated by block 46. If proceeding with the first off-line in-process electrical discharge test, the test is run, and a determination is made as to whether electrical-tree activity or other discharge activity occurred at or about operating voltage level, as indicated by decision block 43.

If no electrical-tree or other electrical discharge is detected during the first off-line in-process electrical discharge test, the cable injected with restorative fluid, as indicated by block 46. If an electrical-tree or other electrical discharge is detected during the first off-line in-process electrical discharge test, the extent of the discharge will be evaluated. Based on the evaluation, the cable may be nevertheless injected, the protocol maybe be abandoned, as indicated by decision block 44, or the damaged portion of the cable (including splices, terminations, etc.) may be repaired or replaced and then optionally re-tested, as indicated by block 45.

Referring to FIG. 1B, after the cable is injected with restorative fluid, but before switching the cable back into service, an optional second off-line in-process electrical discharge test may be selected to assess the fluid injection process, as indicated by block 48. In particular, the second off-line in-process electrical discharge test may be used to determine if electrical-tree development was incited during the injection process, including the testing and switching portions of the process. Additionally, the second off-line in-process test can detect the presence of discharges indicating craftwork errors. Once the off-line post-injection electrical discharge test is selected, the appropriate equipment, test devices, and external power source(s) are connected to the cable and configured to detect electrical-tree or other discharge activity at or around operating voltage level, as indicated by block 52. The off-line post-injection electrical discharge test is then run to determine if discharge activity occurs at or around operating voltage level, as indicated by block 56.

If an electrical tree or other discharge is detected during the off-line post-injection electrical discharge test, the extent of the discharge activity is evaluated, and a determination will be made whether to inject the cable and/or re-energize the cable, as indicated by decision block 62. If, based on the evaluation of the discharge activity, injection or re-energization of the cable is not desired, it will next be determined whether to abandon the injection protocol, as indicated by decision block 64. If the cable rejuvenation injection protocol 10 is not abandoned, the damaged portion of the cable may be repaired or replaced, as indicated by block 66, and then optionally re-tested to determine cable injection suitability. If no electrical tree is detected, the cable is re-energized and left to absorb the injected chemical, as indicated by block 68.

After the cable is injected and switched back into energized service, an on-line post-injection electrical discharge test is selected, as indicated by block 68, to determine whether the final "switching in" processes required to re-energize the cable incited any additional electrical-tree or other discharge development. Once the on-line post-injection electrical discharge test is chosen, the cable is connected to the appropriate test equipment, as indicated by block 76, and the on-line post-injection electrical discharge test is run to determine if discharge activity occurs at operating voltage level, as indicated by block 80.

If a discharge or partial discharge is detected during the on-line post-injection electrical discharge test, the extent of the discharge activity is evaluated, and a determination will be made whether to leave the cable energized or in service, as indicated by decision block 86. If, based on the evaluation of the discharge activity, it is determined not to leave the cable in service, it will next be determined whether to abandon the injection protocol, as indicated by decision block 88. If the cable rejuvenation injection protocol 10 is not abandoned, the damaged portion of the cable may then be repaired or replaced, as indicated by block 66, and the cable may be optionally re-tested to determine cable injection suitability. If no discharges are present during the on-line post-injection electrical discharge test, the cable may be left in service to absorb the injected restorative fluid and monitored for electrical tree or other discharge activity, as indicated by block 92.

Figure 1C:
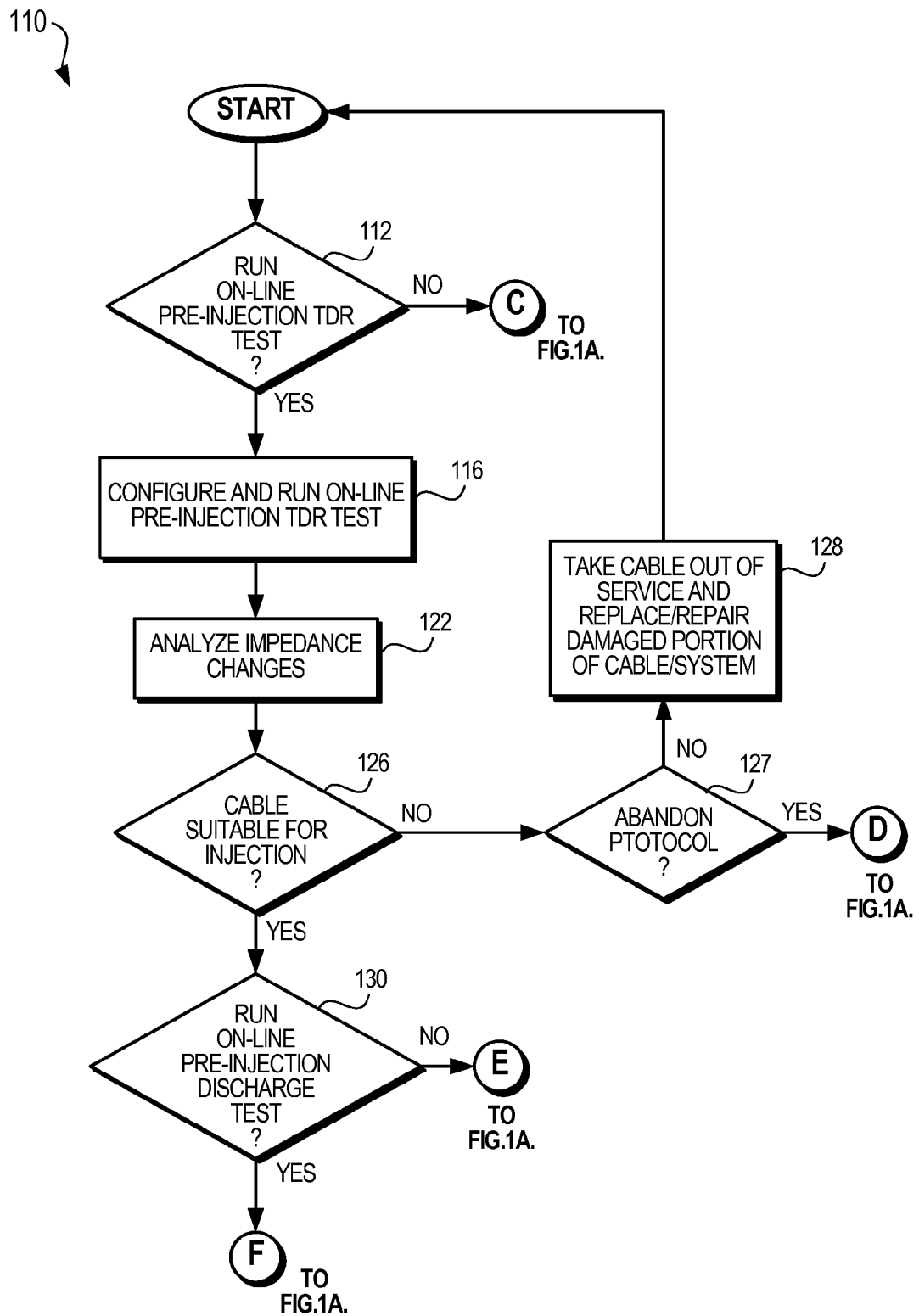
FIG. 1C is a flow chart depicting a first portion of an alternate exemplary embodiment of the cable rejuvenation injection protocol.

Referring to FIG. 1C, the alternate embodiment of a cable rejuvenation injection protocol 110, as referenced above, will now be described. The cable rejuvenation injection protocol 110 uses a TDR pre-injection assessment test to detect and analyze changes in cable impedance for determining cable injection suitability. The cable rejuvenation injection protocol 110 may be used as the sole pre-injection test, or it may instead be incorporated into the cable rejuvenation injection protocol 10 described above as an additional pre-injection test.

To begin the cable rejuvenation injection protocol 110, it is first determined whether to run an on-line pre-injection TDR assessment test for detecting and analyzing changes in cable impedance, as indicated by decision block 112. If it is determined that an on-line pre-injection TDR assessment test is not needed, the operator may proceed to selecting a pre-injection electrical discharge test based, at least in part, on whether the cable is on-line or off-line, as indicated by block 14 in FIG. 1A.

If it is determined that an on-line pre-injection TDR assessment is needed, the cable is configured with the appropriate equipment and test devices, and the on-line pre-injection TDR assessment test is run on the cable, as indicated by block 116. The impedance changes in the cable are then analyzed to determine the cable's injection suitability, as indicated by block 122. For instance, the analysis may include looking for cable splice count, looking for cable neutral condition, etc.

Based on the analysis of the impedance changes, a determination is made whether the cable is suitable for injection, as indicated by decision block 126. For instance, if the impedance changes indicate that the splice count is too high, that the cable neutral is corroded, etc., it may be determined that the cable is unsuitable for injection. If it is determined that the cable is not suitable for injection, the injection protocol 110 may be abandoned, as indicated by decision block 127. If the injection protocol 110 is abandoned, it will next be determined whether to proceed with the injection protocol 10, as indicated by block 37 in FIG. 1A. If the injection protocol 110 is not abandoned, the cable may be taken out of service and replaced or repaired, as indicated by block 128, and the cable may be tested again.

If it is determined that the cable is suitable for injection, it may next be determined whether to run an on-line pre-injection electrical discharge test, as indicated by decision block 130. If an on-line pre-injection electrical discharge test is not needed or desired, the cable may be injected, as indicated by block 44 in FIG. 1A. If it is determined to proceed with an on-line pre-injection electrical discharge test, an on-line pre-injection electrical discharge test may be selected, as indicated by block 18 in FIG. 1A.

While illustrative embodiments have been illustrated and described, it will be appreciated that various changes can be made therein without departing from the spirit and scope of the invention. For instance, it should be appreciated that the cable rejuvenation injection protocols 10 and 110 described with reference to FIGS. 1A-1C are exemplary only. Thus, certain steps or portions of the cable rejuvenation injection protocols 10 and 110 may be rearranged, eliminated, or otherwise altered without departing from the scope of the present disclosure.

The embodiments of the invention in which an exclusive property or privilege is claimed are defined as follows:

1. A method for injecting a cable having an electrically conductive core and an outer insulating layer, wherein the outer insulating layer includes at least one water tree, the injection method comprising: (a) selecting the cable for testing from a population of aged cables, wherein each cable in the population of aged cables has an outer insulating layer and is predicted to have has at least one water tree degrading its outer insulating layer; (b) selecting an on-line pre-injection electrical discharge test for determining if measurable electrical discharge activity occurs in the cable at or about operating voltage of the cable; (c) configuring the cable for the on-line pre-injection electrical discharge test; (d) running the on-line pre-injection electrical discharge test on the cable; (e) injecting the cable with a restorative fluid if no electrical discharge activity is detected in the cable at operating voltage of the cable during the on-line pre-injection electrical discharge test to substantially stop the growth of the at least one water tree and reduce adverse effects of remaining water tree structure; (f) after injecting the cable with a restorative fluid, selecting an on-line post-injection electrical discharge test for determining if electrical discharge activity occurs in the cable at operating voltage of the cable; (g) configuring the cable for the on-line post-injection electrical discharge test; (h) connecting the cable to a system power source; (i) running the on-line post-injection electrical discharge test on the cable; and (j) leaving the cable on-line if no electrical discharge activity is detected in the cable at operating voltage of the cable during the on-line post-injection electrical discharge test.

2. The method of claim 1, wherein the on-line post-injection electrical discharge test is an on-line partial discharge test.

3. The method of claim 1, further comprising performing at least one of taking the cable off-line and repairing a damaged portion of the cable if electrical discharge activity occurs in the cable at operating voltage of the cable during the on-line post-injection electrical discharge test.

4. The method of claim 1, wherein the on-line pre-injection electrical discharge test is an on-line partial discharge test.

5. The method of claim 1, further comprising taking the cable off-line and repairing a damaged portion of the cable if electrical discharge activity occurs in the cable at operating voltage of the cable during the on-line pre-injection electrical discharge test.

6. The method of claim 1, further comprising:
(a) configuring the cable for injection and selecting an off-line in-process electrical discharge test for determining if electrical discharge activity occurs in the cable at operating voltage of the cable after configuring the cable for injection but before injecting the cable;
(b) configuring the cable for the off-line in-process electrical discharge test;
(c) running the off-line in-process electrical discharge test on the cable; and
(d) proceeding with the cable injection if no electrical discharge activity is detected in the cable at operating voltage of the cable during the off-line in-process electrical discharge test.

7. The method of claim 1, further comprising running the on-line post-injection electrical discharge test within about seven days of connecting the cable to the system power source.

8. The method of claim 1, further comprising automatically sensing and monitoring the cable for electrical discharge activity in the cable after running the on-line post-injection electrical discharge test.

9. The method of claim 8, wherein the sensing and monitoring is performed for at least the first three months of cable operation after running the on-line post-injection electrical discharge test.

10. A method for injecting a cable having an electrically conductive core and an outer insulating layer, wherein the outer insulating layer includes at least one water tree, the injection method comprising: selecting the cable for testing from a population of aged cables, wherein each cable in the population of aged cables has an outer insulating layer and has at least one water tree degrading its outer insulating layer; (b) injecting the cable with a restorative fluid to substantially stop the growth of the at least one water tree and reduce adverse effects of remaining water tree structure; (c) after injecting the cable with a restorative fluid, selecting an on-line post-injection electrical discharge test for determining if electrical discharge activity occurs in the cable at operating voltage of the cable; (d) configuring the cable for the on-line post-injection electrical discharge test; (e) connecting the cable to a system power source; (f) running the on-line post-injection electrical discharge test on the cable; and (g) leaving the cable on-line if no electrical discharge activity is detected in the cable at operating voltage of the cable during the on-line post-injection electrical discharge test.

11. The method of claim 10, wherein the on-line post-injection electrical discharge test is an on-line partial discharge test.

12. The method of claim 10, further comprising performing at least one of taking the cable off-line and repairing a damaged portion of the cable if electrical discharge activity occurs in the cable at operating voltage of the cable during the on-line post-injection electrical discharge test.

13. The method of claim 10, further comprising taking the cable off-line and repairing a damaged portion of the cable if electrical discharge activity occurs in the cable at operating voltage of the cable during the on-line pre-injection electrical discharge test.

14. The method of claim 10, further comprising:
(a) configuring the cable for injection and selecting an off-line in-process electrical discharge test for determining if electrical discharge activity occurs in the cable at operating voltage of the cable after configuring the cable for injection but before injecting the cable;
(b) configuring the cable for the off-line in-process electrical discharge test;
(c) running the off-line in-process electrical discharge test on the cable; and
(d) proceeding with the cable injection if no electrical discharge activity is detected in the cable at operating voltage of the cable during the off-line in-process electrical discharge test.

15. The method of claim 10, further comprising running the on-line post-injection electrical discharge test within about seven days of connecting the cable to the system power source.

16. The method of claim 10, further comprising automatically sensing and monitoring the cable for electrical discharge activity in the cable after running the on-line post-injection electrical discharge test.

17. The method of claim 16, wherein the sensing and monitoring is performed for at least the first three months of cable operation after running the on-line post-injection electrical discharge test.

* * * * *